US005608739A

United States Patent [19]
Snodgrass et al.

[11] Patent Number: 5,608,739
[45] Date of Patent: Mar. 4, 1997

[54] APPARATUS AND METHOD FOR ERROR DETECTION AND CORRECTION IN RADIO FREQUENCY IDENTIFICATION DEVICE

[75] Inventors: Charles K. Snodgrass, Boise, Id.; Armando Montalvo, Belmont, Calif.

[73] Assignee: Micron Technology, Inc., Boise, Id.

[21] Appl. No.: 525,944

[22] Filed: Sep. 8, 1995

Related U.S. Application Data

[63] Continuation of Ser. No. 130,124, Sep. 30, 1993, Pat. No. 5,479,416.
[51] Int. Cl.⁶ .................................................... G06F 11/10
[52] U.S. Cl. .......................................... 371/37.1; 371/38.1
[58] Field of Search .......................... 371/32, 33, 37.1, 371/38.1, 39.1, 40.1, 37.7

[56] References Cited

U.S. PATENT DOCUMENTS

| | | | |
|---|---|---|---|
| 4,718,067 | 1/1988 | Peters | 371/38.1 |
| 4,888,767 | 12/1989 | Foruya et al. | 370/60 |
| 5,479,416 | 12/1995 | Snodgrass et al. | 371/37.1 |

*Primary Examiner*—Roy N. Envall, Jr.
*Assistant Examiner*—Thomas E. Brown
*Attorney, Agent, or Firm*—Dorr, Carson, Sloan & Birney, P.C.

[57] ABSTRACT

An RF identification system has a forward link that includes an encoder and decoder that utilize an (8, 13, 4) block code. The (8, 13, 4) block code has the ability to detect one bad bit in a thirteen-bit block, and can always detect two bad bits per block.

6 Claims, 8 Drawing Sheets

$$G = \begin{bmatrix} 1 & 0 & 0 & 0 & 0 & 0 & 0 & 0 & 0 & 1 & 1 & 1 \\ 0 & 1 & 0 & 0 & 0 & 0 & 0 & 0 & 1 & 1 & 0 & 0 & 1 \\ 0 & 0 & 1 & 0 & 0 & 0 & 0 & 0 & 1 & 0 & 1 & 0 & 1 \\ 0 & 0 & 0 & 1 & 0 & 0 & 0 & 0 & 0 & 1 & 1 & 0 & 1 \\ 0 & 0 & 0 & 0 & 1 & 0 & 0 & 0 & 0 & 1 & 0 & 1 & 1 \\ 0 & 0 & 0 & 0 & 0 & 1 & 0 & 0 & 1 & 0 & 0 & 1 & 1 \\ 0 & 0 & 0 & 0 & 0 & 0 & 1 & 0 & 0 & 1 & 1 & 1 & 0 \\ 0 & 0 & 0 & 0 & 0 & 0 & 0 & 1 & 1 & 0 & 1 & 1 & 0 \end{bmatrix}$$

Fig. 5

$$I_j = \begin{bmatrix} i_1 & i_2 & i_3 & i_4 & i_5 & i_6 & i_7 & i_8 \end{bmatrix}$$

$$C^j = \begin{bmatrix} i_1 & i_2 & i_3 & i_4 & i_5 & i_6 & i_7 & i_8 & p_1 & p_2 & p_3 & p_4 & p_5 \end{bmatrix}$$

Syndrome Look up Table / 85

| Syndrome $S_1 S_2 S_3 S_4 S_5$ | Coset Leader |
|---|---|
| 0 0 0 0 0 | 0 0 0 0 0 0 0 0 0 0 0 0 0 |
| 0 0 1 1 1 | 1 0 0 0 0 0 0 0 0 0 0 0 0 |
| 1 1 0 0 1 | 0 1 0 0 0 0 0 0 0 0 0 0 0 |
| 1 0 1 0 1 | 0 0 1 0 0 0 0 0 0 0 0 0 0 |
| 0 1 1 0 1 | 0 0 0 1 0 0 0 0 0 0 0 0 0 |
| 0 1 0 1 1 | 0 0 0 0 1 0 0 0 0 0 0 0 0 |
| 1 0 0 1 1 | 0 0 0 0 0 1 0 0 0 0 0 0 0 |
| 0 1 1 1 0 | 0 0 0 0 0 0 1 0 0 0 0 0 0 |
| 1 0 1 1 0 | 0 0 0 0 0 0 0 1 0 0 0 0 0 |
| 1 0 0 0 0 | 0 0 0 0 0 0 0 0 1 0 0 0 0 |
| 0 1 0 0 0 | 0 0 0 0 0 0 0 0 0 1 0 0 0 |
| 0 0 1 0 0 | 0 0 0 0 0 0 0 0 0 0 1 0 0 |
| 0 0 0 1 0 | 0 0 0 0 0 0 0 0 0 0 0 1 0 |
| 0 0 0 0 1 | 0 0 0 0 0 0 0 0 0 0 0 0 1 |

APPARATUS AND METHOD FOR ERROR DETECTION AND CORRECTION IN RADIO FREQUENCY IDENTIFICATION DEVICE

CROSS REFERENCE TO RELATED APPLICATION(S)

This is a continuation of application Ser. No. 08/130,124, filed on Sep. 30, 1993, now U.S. Pat. No. 5,479,416.

BACKGROUND OF THE INVENTION

1. Field of the Invention

The invention in general relates to error detection in radio frequency (RF) communication devices, and more particularly to a block code error detection and correction device and method particularly suitable for use in a radio frequency identification (RFID) system.

2. Statement of the Problem

There are many different situations in which it is useful to be able to identify objects. For example, individual products or cartons of products are usually identified in stores or warehouses for inventory, sales, or other purposes. Or suitcases and packages in transit may be temporarily identified. In the past identification has been by printing or writing identification labels on the individual objects. Recently bar codes that can be automatically read by optical scanners have largely replaced other types of labeling. Now, a small, inexpensive electronic identification device, called a radio frequency identification (RFID) tag has been developed. An RFID tag is an integrated circuit chip having a simple processor and memory, an RF circuit, and a power source, usually a battery. The memory can be programmed to hold identification information. When a remote device, generally referred to as an interrogator, broadcasts a request for identification, the RFID tag responds with its stored information. Such an RFID system permits inventories to be automatically performed electronically, permits objects to be identified with more security, and has many other advantages. See for example, U.S. patent application Ser. No. 899,777.

In RFID systems it is important that the information broadcast by the interrogator and received by the RFID tag, and vice versa, be as error free as possible. Since the RFID systems may be used in areas where radio frequency interference may be common, it is important that error detection and correction devices be incorporated into the electronics of both the interrogator and the RFID tag. The present invention relates to error detection and correction apparatus and methods particularly useful in the RFID forward link. That is, the link between the interrogator and the RFID tag, as distinguished from the return link between the tag and the interrogator.

It is well-known to detect and correct errors in digital communications, and in particular RF communications, using mathematical codes. One common mathematical theory which is useful in developing error detection and correction codes is the theory of Galois fields. The mathematics discussed herein, including the mathematical operations $+$, $-$, $:$, etc., will be Galois field mathematics unless otherwise indicated. Symbols in bold are Galois field vectors or matrices. Typically, a code developed using Galois field theory will add additional bits to an information signal, which additional bits can be used to determine if errors occurred, and, in some cases, what the errors were. One well-known type of code developed from Galois field theory and used in error detection and correction systems is block code. Block code is a code in which the input data stream is divided into blocks of k bits, where k is an integer, and each block of k bits is mapped, one-to-one, onto a block of n bits, where n is an integer greater than k. There are then n–k redundant bits which are used to detect and correct errors. In a k bit block of binary bits there are $2^k$ possible different signals, which we shall refer to as k-tuples, and in an n bit block there are $2^n$ different signals, which we shall refer to as n-tuples. The code C is defined by the mapping of each k-tuple into a distinct n-tuple. If $C^i$ is an n-tuple, called a codeword, that corresponds to the ith information k-tuple, then the set of codewords $C=[C^1, C^2, \ldots C^k]$ defines the code C. An important parameter relating any two binary n-tuples x and y is the Hamming distance, d(x,y). The Hamming distance is the number of places in which the two binary n-tuples differ. The minimum distance, $d_c$, of a code C, is the Hamming distance of the pair of code words in the code having the smallest Hamming distance, or in other words, the smallest number of places in which any two codewords differ. The minimum distance, $d_c$, is an important parameter in error correction because when an error occurs, it changes one or more of the places in the original signal, and the larger the minimum distance is in a code, the more likely it is that an error can be corrected. A block code is generally identified by the parameters (k, n, $d_c$); thus (2, 5, 3) block code is a block code that translates a 2-bit information vector into a 5-bit codeword and has a minimum distance of 3.

A systematic block code is one in which each code word, $C^i$, contains the k information bits unmodified. The remaining n–k bits are called the parity bits. There are $2^k$ codewords in a Code C. Since there are $2^k$ distinct n-tuples, or codewords, in a code C, C can be seen as a subspace of dimension k in an n-dimensional space that includes all the possible $2^k$ n-tuples.

In block code theory it is possible to describe the code C in terms of a generator matrix G such that $C^i = I_i G$ where $I_i$, the ith information word, is a k-tuple of information bits to be encoded and $C^i$ is the corresponding n-tuple codeword. For systematic block codes the matrix G can be written as $G=[I:P]$ where I is the identity matrix, and P is called the parity check matrix.

It is also possible to define a matrix $C^\perp$ that is an orthogonal complement to C. $C^\perp$ is a subspace of dimension n–k, and any n–k linearly independent vectors that are orthogonal to C provide a set of basis vectors for this subspace. H is defined as an matrix having these basis vectors as rows. This matrix H is orthogonal to all codewords $C^i$, that is $C^i H^t = 0$, where $H^t$ denotes the transpose of the matrix H obtained by interchanging rows to obtain columns in H. For linear systematic block codes, $H=[-P:I]$. This provides a way of checking if a received word, v, is a codeword. Thus H is called the parity check matrix of the code. It is an n–k by n matrix.

The theory of linear block codes defines the syndrome, S of a received word, v, as $S=vH^t$. If v is expressed as a codeword plus an error, i.e., $v=C+e$, where C is a codeword and e is an error pattern, then $S=vH^t=(C+e)H^t=eH^t$, which shows that the syndrome, S, is completely dependent on the error pattern. This allows a vector, called a coset leader, l, to be defined which is the error associated with the syndrome, S. Since S is related to v through a matrix product with the parity check matrix $H^t$, by tabulating all the coset leaders and their corresponding syndromes, a table can be created from which for any received word v the error can be found, providing the error is detectable. This permits the decoding of a received signal as follows. Given a received word v, compute the syndrome and look up its coset leader. If the syndrome corresponds to a correctable error, subtract the coset leader from v, to correct the error. If the syndrome corresponds to an uncorrectable error, then output a signal indicating that an error has occurred which is not correctable.

Applying the above known theory to RFID systems, because the interrogator can be connected to a standard AC power source, or will be significantly larger than the RFID tag and thus have larger batteries, the RFID forward data link generally operates at relatively high power compared to the return link, and thus will have a relatively high signal-to-noise ratio. Thus errors will ordinarily be limited to one or two bits in a typical information block. Thus the error detection system needs only to be capable of detecting and/or correcting two error bits in the typical block transmitted. Higher capabilities would be wasteful.

Although the error detection capability can be relatively low, it is important that the density of information transmitted be relatively high. That is, every error detection system adds extra bits to the data transmitted. These extra bits make each transmission longer. A typical prior art error detection scheme used in simple RF communication devices is (4, 8, 4) block code. This block code adds four extra bits for every four data bits transmitted. These extra bits require that the receiver in the RFID tag be twice as long as is necessary to receive the information bits. If a code could be found that provided the same error detection capability with fewer added bits, then the use of power in the RFID tag could be reduced, giving it longer life, and/or allowing it to have a smaller battery and thus be less expensive to manufacture.

In an electronic decoding device, the logic equations discussed above which relate the syndrome to the parity check matrix and which find the corrected signal from the received signal, are implemented in digital logic electronic components. It is desirable that the electronic logic circuit required to implement these functions be as simple as possible in order that the circuits be small and inexpensive.

For the RFID forward link, this is particularly important for the decoding components, since there is only limited space available for a circuit in the RFID tag, and since many tags are used in an RFID system, the individual tag must be inexpensive to keep the cost of the total system low. Thus there is a need for an RFID forward link that utilizes a block code that has a relatively small number of parity bits for a given error correction capability, and which is implementable with a relatively small number of inexpensive electronic components.

3. Solution to the Problem

The invention solves the above problems by providing an electronic error correction system which utilizes (8, 13, 4) block code. The (8, 13, 4) block code adds five extra bits for every eight data bits transmitted. Compared to the prior art (4, 8, 4) block code, which adds four extra bits for every four data bits transmitted, the (8, 13, 4) block code uses 19% less bits for the same error correction capability.

The (8, 13, 4) block code is capable of correcting one bad bit in each thirteen-bit block. Further, it can always detect two bad bits per thirteen-bit block. Thus it is capable of detecting virtually every error in an RFID forward link, and can correct most errors without requiring repeated transmissions.

The invention also provides a unique parity matrix for implementing the (8, 13, 4) block code which results in a simple encoder and decoder.

The invention further provides a very simple error detection circuit that is implemented in a minimum number of logic elements.

SUMMARY OF THE INVENTION

The invention provides a radio frequency identification system comprising: a source of an eight-bit information signal; (8, 13, 4) block code encoder means responsive to the eight-bit information signal for providing a thirteen-bit coded signal; radio frequency transmitter means responsive to the thirteen-bit coded signal for providing a transmitted signal; (8, 13, 4) block code decoder means for decoding the transmitted signal to provide an eight-bit decoded signal; and identifier means responsive to the eight-bit decoded signal for providing a return identification signal. Preferably, the decoder means further comprises error detection circuit means for providing a signal indicative that a noncorrectable error in the transmitted signal has been detected. Preferably, the error detection circuit means comprises eleven gates. Preferably, the eleven gates comprise two exclusive-OR gates, five AND gates, an OR gate, and three inverters. Preferably, the encoder procedure encodes an eight-bit information signal into a thirteen-tuple code word. Preferably, the first eight bits of the coded signal comprise the eight bits, $i_1$, $i_2$, $i_3$, $i_4$, $i_5$, $i_6$, $i_7$, and $i_8$, of the information signal. The last five bits of the coded signal comprise a first parity bit, a second parity bit, a third parity bit, a fourth parity bit, and a fifth parity bit. Preferably, the first parity bit comprises the Galois field algebraic sum of $i_2$, $i_3$, $i_6$, and $i_8$. Preferably, second parity bit comprises the Galois field algebraic sum of $i_2$, $i_4$, $i_5$, and $i_7$. Preferably, the third parity bit comprises the Galois field algebraic sum of $i_1$, $i_3$, $i_4$, $i_7$, and $i_8$. Preferably, the fourth parity bit comprises the Galois field algebraic sum of $i_1$, $i_5$, $i_6$, $i_7$, and $i_8$. Preferably, the fifth parity bit comprises the Galois field algebraic sum of $i_1$, $i_2$, $i_3$, $i_4$, $i_5$, and $i_6$.

In another aspect the invention provides a communication error detection and correction system comprising: a source of an eight-bit information signal; (8, 13, 4) block code encoder means responsive to the eight-bit information signal for providing a thirteen-bit coded signal; communication means responsive to the thirteen-bit coded signal for providing a communicated signal; and (8, 13, 4) block code decoder means for decoding the transmitted signal to provide an eight-bit decoded signal. Preferably, the decoder means further comprises error detection circuit means for providing a signal indicative that a noncorrectable error in the communicated signal has been detected. Preferably, the error detection circuit means comprises eleven gates. Preferably the first eight bits of the coded signal comprise the eight bits, $i_1$, $i_2$, $i_3$, $i_4$, $i_5$, $i_6$, $i_7$, and $i_8$, of the information signal, and the last five bits of the coded signal comprise a first parity bit, a second parity bit, a third parity bit, a fourth parity bit, and a fifth parity bit. Preferably, the first parity bit comprises the Galois field algebraic sum of $i_2$, $i_3$, $i_6$, and $i_8$, the second parity bit comprises the Galois field algebraic sum of $i_2$, $i_4$, $i_5$, and $i_7$, the third parity bit comprises the Galois field algebraic sum of $i_1$, $i_3$, $i_4$, $i_7$, and $i_8$, the fourth parity bit comprises the Galois field algebraic sum of $i_1$, $i_5$, $i_6$, $i_7$, and $i_8$, and the fifth parity bit comprises the Galois field algebraic sum of $i_1$, $i_2$, $i_3$, $i_4$, $i_5$, and $i_6$.

In a further aspect the invention provides a method of correcting and detecting errors in communication, the method comprising the steps of: providing an eight-bit information signal; utilizing (8, 13, 4) block code to code the eight-bit information signal to providing a thirteen-bit coded signal; communicating the thirteen-bit coded signal; and utilizing (8, 13, 4) block decoder to decode the communicated thirteen-bit encoded signal to provide an eight-bit decoded signal, to correct the decoded signal when correctable errors occur in the communicated signal, and to provide an error signal indicative that an error has occurred when an uncorrectable but detectable error occurs in the communicated thirteen-bit coded signal.

The invention not only provides an efficient error detection system that is implementable with a minimum of electronic components, but it also provides an error detection system that is remarkably well suited to the RFID forward link. It utilizes thirteen-bit blocks of information, which requires registers of about thirteen bits or less in length, which is well suited to being implemented inexpensively and compactly with present technology. Eight of the bits in each block are information bits, thus the system according to the invention is capable of transmitting information at approximately eighty one percent higher than the rate of the prior art (4, 8, 4) block code based devices. Numerous other features, objects and advantages of the invention will become apparent from the following description when read in conjunction with the accompanying drawings.

DESCRIPTION OF THE PREFERRED EMBODIMENT

1. Overview

Figure 1:
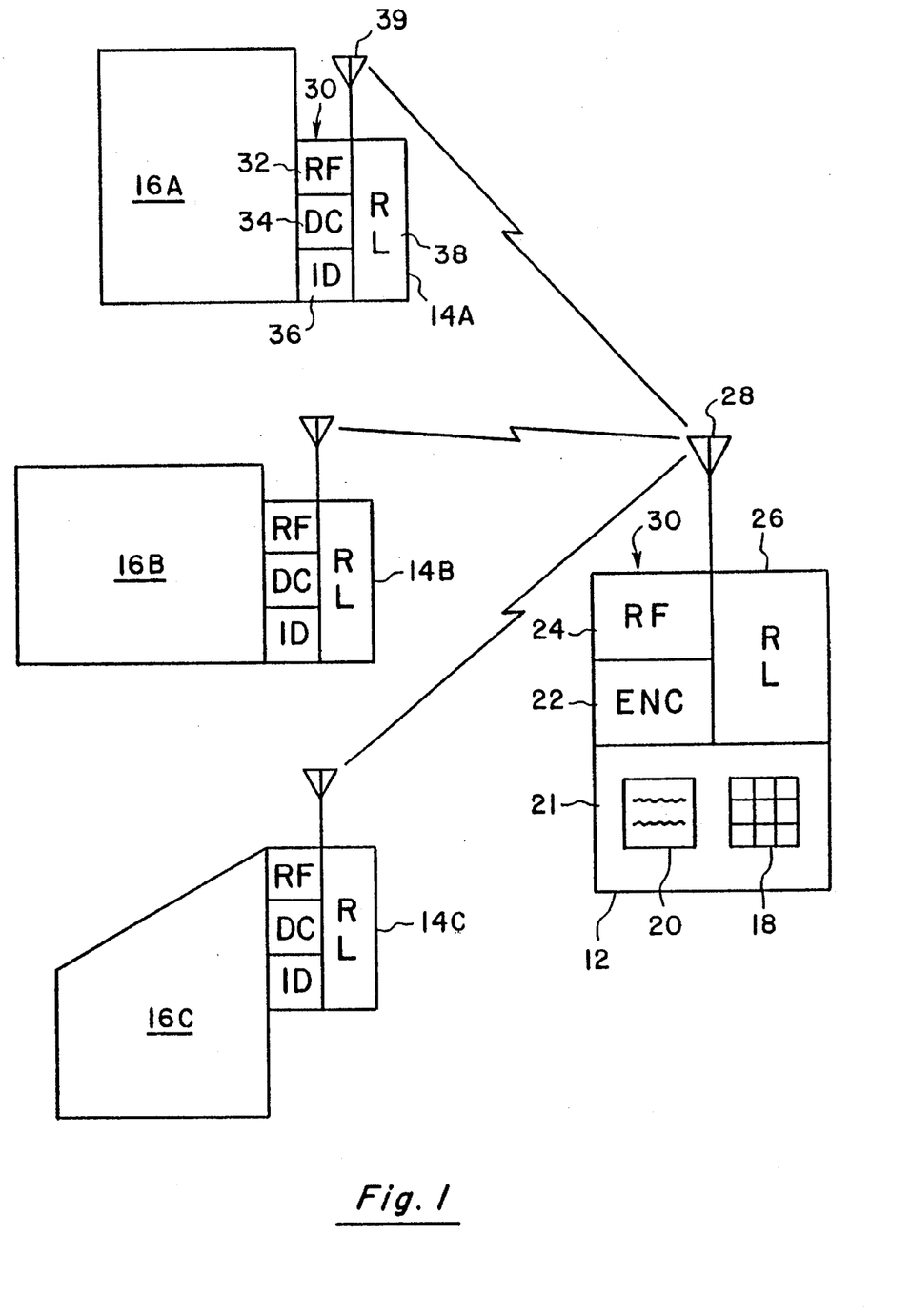
FIG. 1 is a block diagram of an RFID system according to the invention.

FIG. 1 shows a radio frequency identification (RFID) system 10 according to the invention. RFID system 10 includes an interrogator 12 and a number of RFID tags such as 14A, 14B, and 14C. Each tag 14A, 14B, and 14C is attached to an object 16A, 16B, 16C which is identified by its tag. It should be understood that the particular embodiment described herein is exemplary, and is described in detail to more clearly and fully depict the invention than would otherwise be possible; it is not meant to limit the invention to this particular embodiment. In particular it should be understood that a very large number of RFID tags 14A–14C may be used in conjunction with one or more interrogators 12. Also, RFID tags 14A–14C may be manufactured separately from interrogator 12 and combined with an interrogator 12 to provide the RFID system 10 in accordance with the present invention.

The preferred embodiment of the interrogator 12 includes input means 18, which may be a keypad or other input device, output means 20, which may be a display 20 or other output device, interrogator processor and memory means 21, encoder 22 which encodes the interrogation information, RF section 24 which broadcasts the coded information, return link receiving unit 26 which receives and decodes return information from the RFID tags 14A, 14B, and 14C, and aerial 28 through which the forward and return signals are broadcast and received. RFID tags 14A, 14B, and 14C are substantially identical except for programming. Hence, only one tag, 14A, is described.

RFID tag 14A includes RF section 32 and decoder 34. Tag 14A also includes identification storage and processing means 36, return link sending unit 38, and aerial 39 which may be used by both forward link RF section 32 and return link sending unit 38. The RF section 32 receives information broadcast from interrogator 12, the decoder 34 decodes the information, and identification storage and processing means 36 uses the information to either remain silent or to return its stored identification information via return link sending unit 38. Encoder 22 and RF section 30 of interrogator 12 and RF section 32 and decoder 34 of RFID tag 14A may together be considered to be the "forward link" 30.

Figure 2:
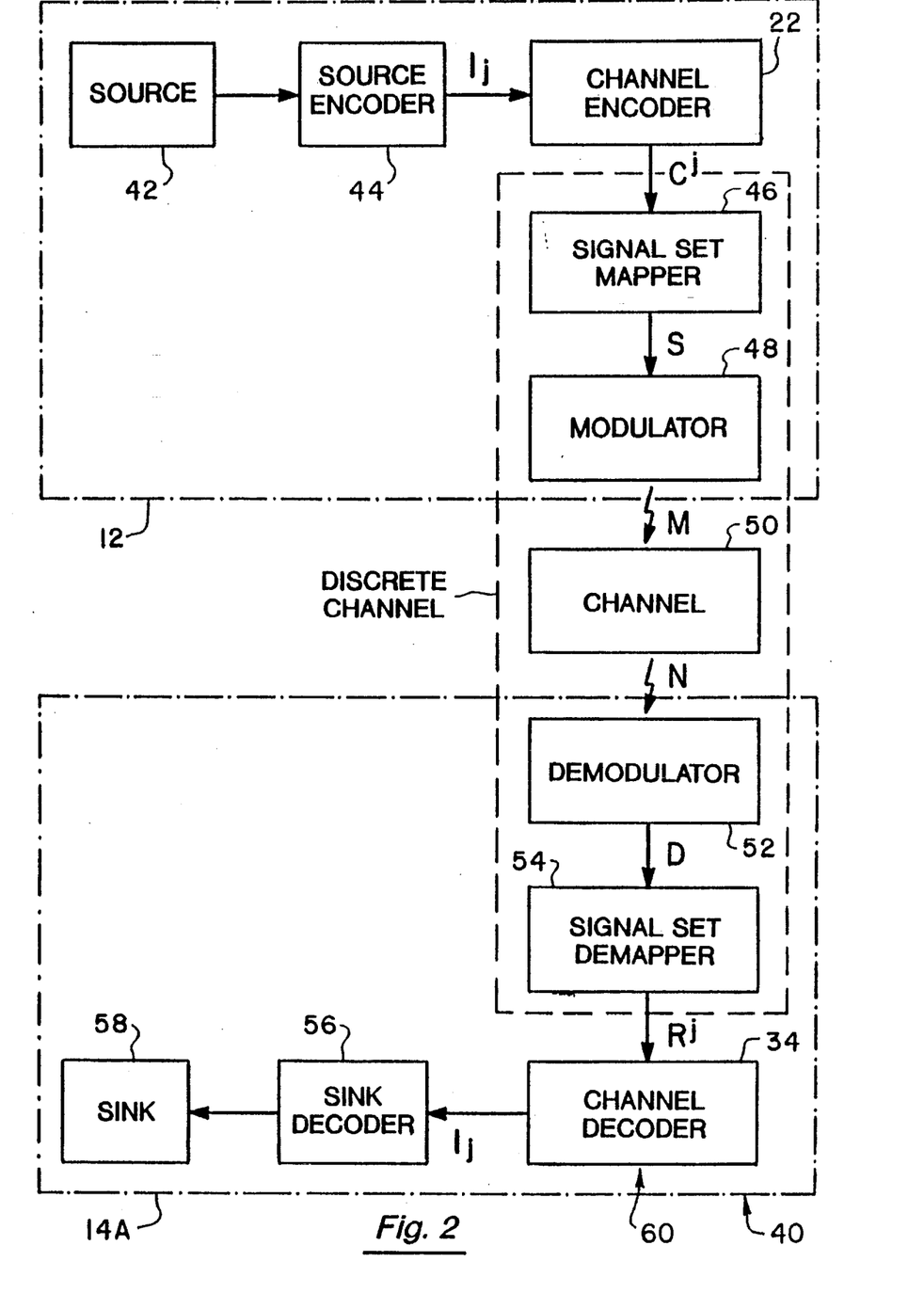
FIG. 2 is a block diagram of an RF communication system utilized in the RFID system of FIG. 1, with the signals utilized in the error detection and correction system according to the invention indicated.

A block diagram of an RF communications system 40 utilized in the invention is shown in FIG. 2. Communications system 40 includes a source 42 of information which includes input 18 and processor and memory means 21 of interrogator 12, a source encoder 44 which places the information received from source 42 in block form to provide a information signal $I_j$, a channel encoder 22 which encodes the bits in the information signal $I_j$ to form the coded digital signal $C^j$, a signal set mapper 46 which maps the coded signals $C^j$ into a set of signals S suitable for being broadcast, and a modulator 48 which transforms the signal S into a modulated RF signal M. The above-described portions 42, 44, 22, 46, and 48 of communication system 40 are all part of interrogator 12.

In traveling through the channel 50, noise is introduced into the signal M to produce the signal N. The communications system 40 also includes demodulator 52 which receives signal N and demodulates it to produce signal D, signal set demapper 54 which maps the signal D to a digital encoded signal set $R^j$ which may include errors, channel decoder 34 which decodes the signal $R^j$ and corrects it to reproduce the block-form information signal $I_j$, a sink decoder 56 which translates the block-form information signal $I_j$ into a form that it can be used by the identification processor and memory means 36, and a sink 58 which is the end receiver or user of the communication which includes identification processor and memory means 36. The latter portions 52, 54, 34, 56 and 58 of the communication system 40 are part of the RFID tag 14A. The discussion of the invention will focus on the channel encoder 22 and channel decoder 34 portions of the communication system 40, which are the portions in which the error correction principally takes place.

2. Channel Encoder Details

Figure 3:
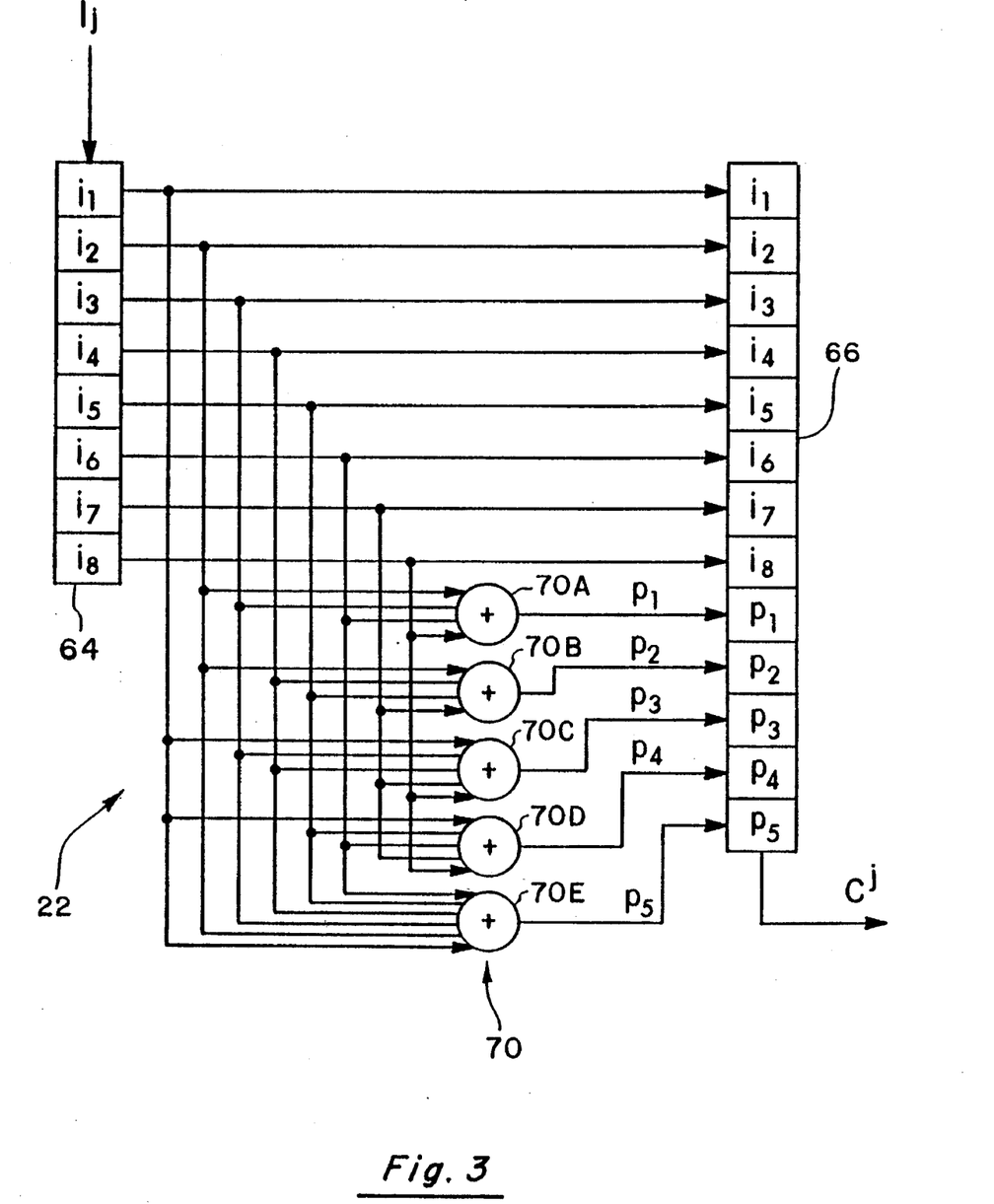
FIG. 3 shows a preferred embodiment of an encoder utilized in the RFID system of FIG. 1.

FIG. 3 shows a detailed circuit diagram of the encoder 22. Encoder 22 includes eight-bit input register 64, thirteen-bit output register 66, and parity logic means 70. Parity logic means 70 comprises four-bit exclusive-ORs 70A and 70B, five-bit exclusive-ORs 70C and 70D, and six-bit exclusive-OR 70E. The outputs of the 2nd, 3rd, 6th, and 8th stages in register 64 are connected to exclusive-OR 70A. The outputs of the 2nd, 4th, 5th and 7th stages in register 64 are connected to exclusive-OR 70B. The outputs of the 1st, 3rd, 4th, 7th, and 8th, stages in register 64 are connected to exclusive-OR 70C, the outputs of the 1st, 5th, 6th, 7th, and 8th stages of register 64 are connected to exclusive-OR 70D, and the outputs of the 1st, 2nd, 3rd, 4th, 5th, and 6th stages of register 64 are connected to exclusive-OR 70E. The outputs of exclusive-ORs 70A, 70B, 70C, 70D, and 70E, respectively are connected to the 9th, 10th, 11th, 12th, and 13th stages respectively of output register 66.

Figure 4:
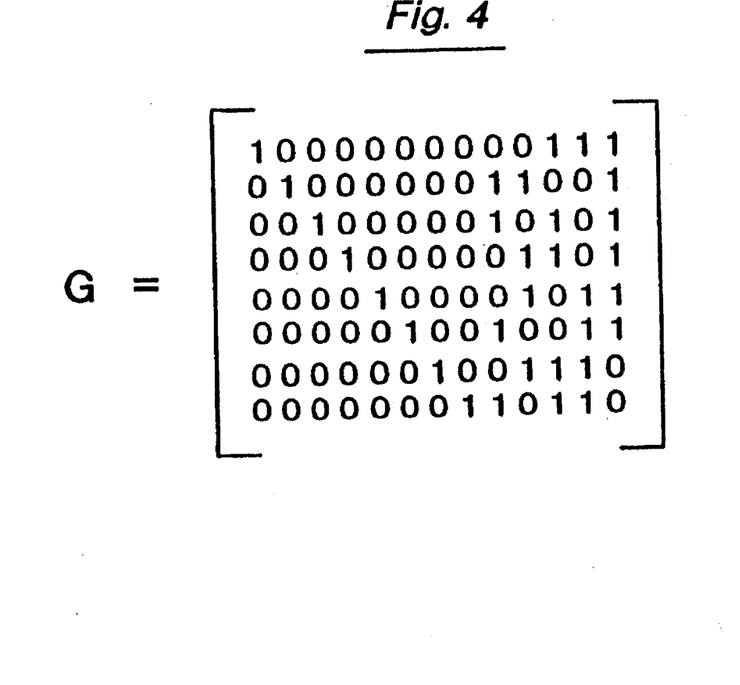
FIG. 4 shows the generator matrix for the (8, 13, 4) block code utilized in the RFID system of FIG. 1.
Figure 5:
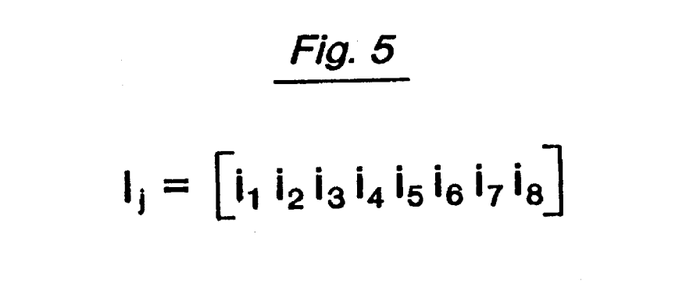
FIG. 5 illustrates the jth information word utilized in the RFID system of FIG. 1.
Figure 6:
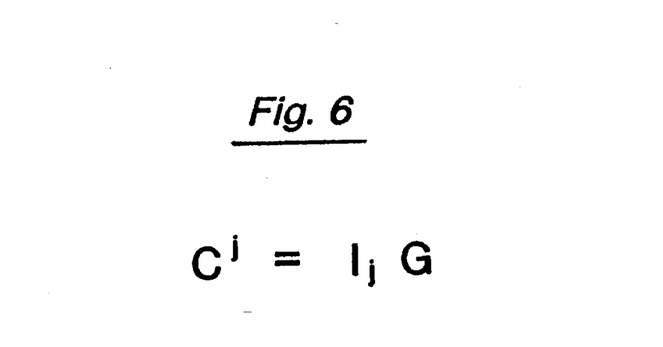
FIG. 6 shows the relationship between the generator matrix, the jth information word, and the jth codeword.
Figure 7:
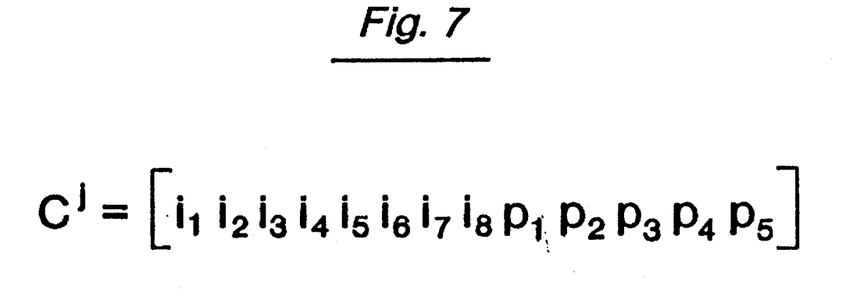
FIG. 7 shows the jth codeword in the (8, 13, 4) block code according to the invention utilized in the RFID system of FIG. 1.
Figure 8:
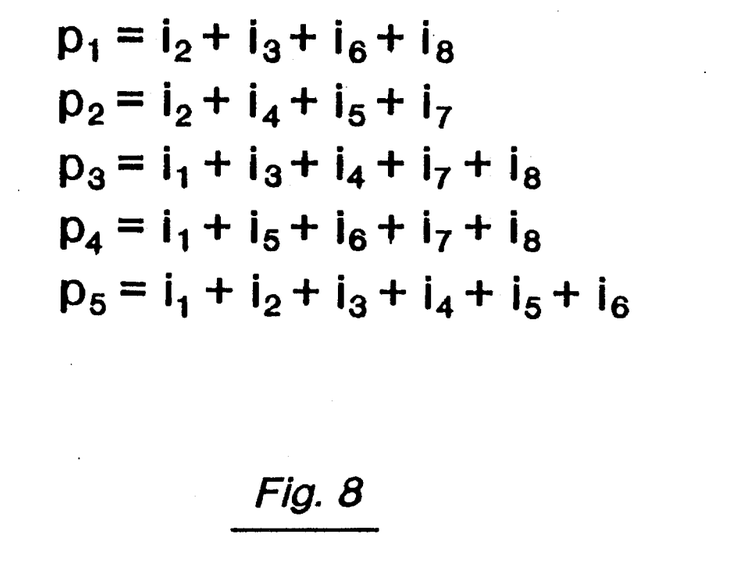
FIG. 8 illustrates how the individual bits of the parity matrix utilized in the RFID system of FIG. 1 are related to the bits of the information word $I_j$.

Encoder 22 is an (8, 13, 4) block code encoder. The (8, 13, 4) block code according to the invention is a linear systematic block code. The generator matrix G for the (8, 13, 4) block code is shown in FIG. 4. Since G=[I:P], the first eight columns of the matrix or FIG. 4 is the information signal matrix, I, and the last five columns are the parity matrix, P. The (8, 13, 4) block code encodes an eight-bit information signal, $I_j=[i_1, i_2, i_3, i_4, i_5, i_6, i_7, i_8]$ shown in FIG. 5, to produce a thirteen-bit codeword $C^j$, shown in FIG. 7. The vector equation which generates the codewords $C^j$ from the generator matrix G is shown in FIG. 6. The Galois field relationship between the individual parity bits $P_1$, $P_2$, etc. and the individual information word bits, $i_1$, $i_2$, etc. is shown in FIG. 8.

The mathematical operations just described are performed electronically in the (8, 13, 4) block code encoder of FIG. 3. An eight-bit information vector $I_j$ is input into input register 64. The 2nd, 3rd, 6th, and 8th bits of $I_j$ are added to form the 9th bit of codeword $C^j$. The 2nd, 4th, 5th and 7th bits of $I_j$ are added to form the 10th bit of codeword $C^j$. The 1st, 3rd, 4th, 7th, and 8th bits of $I_j$ are added to form the 11th bit of codeword $C^j$. The 1st, 5th, 6th, 7th, and 8th bits of $I_j$ are added to form the 12th bit of codeword $C^j$. The 1st, 2nd, 3rd, 4th, 5th, and 6th bits of $I_j$ are added to form the 13th bit of codeword $C^j$.

3. Channel Decoder Details

Figure 9:
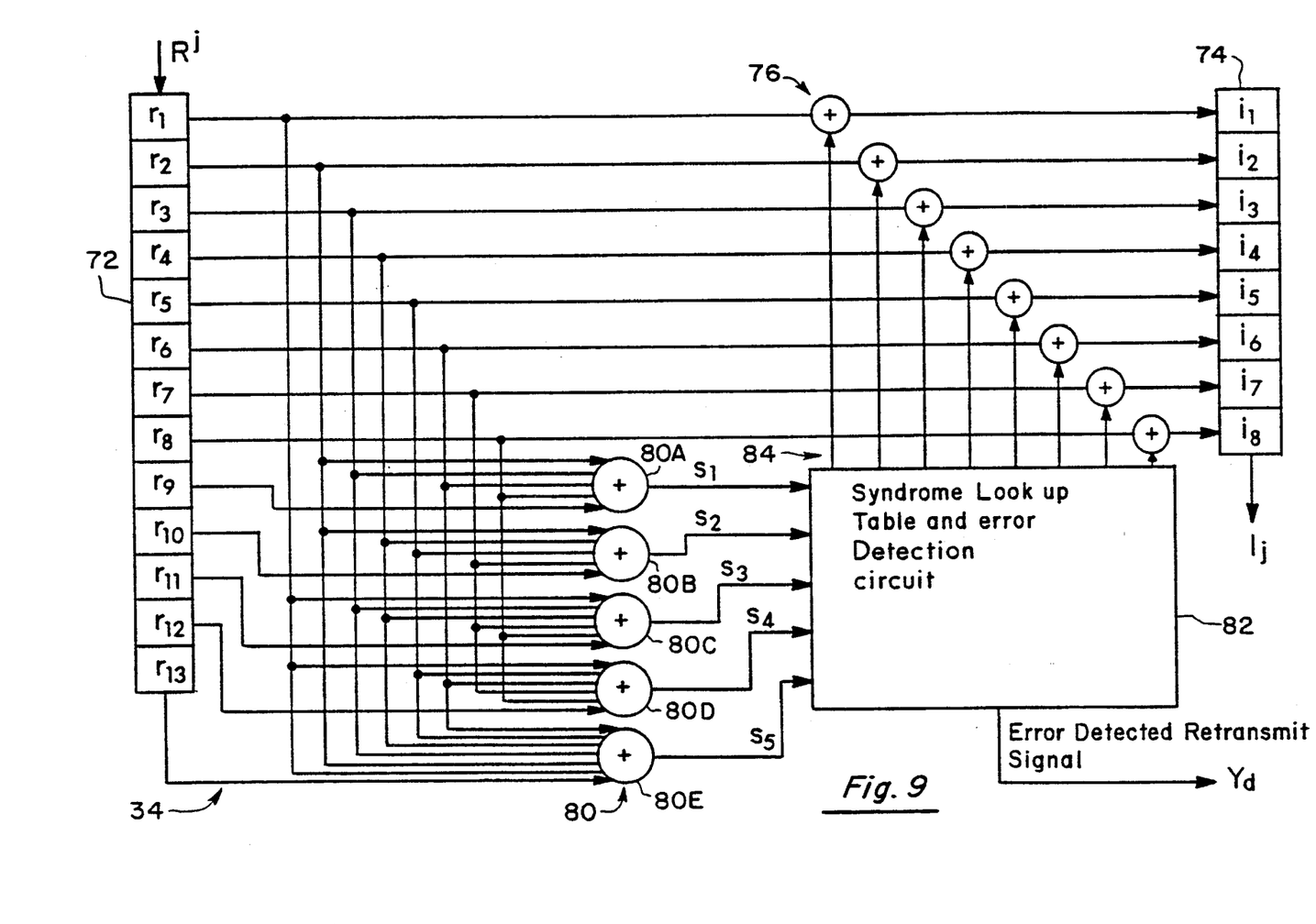
FIG. 9 shows the preferred embodiment of a decoder utilized in the RFID system of FIG. 1.

A circuit diagram of the channel decoder 34 is shown in FIG. 9. Decoder 34 comprises thirteen-bit register 72, eight-bit register 74, eight coset exclusive-ORs 76, five syndrome exclusive-ORs 80A through 80E, and syndrome look up table and error detection circuit 82. Syndrome look up table and error detection circuit 82 comprises a thirty-two-bit EPROM which provides the coset leaders, shown at the right in the syndrome look up table 85 in FIG. 11, on the eight outputs 84 in response to the fourteen syndromes, shown at the left of the syndrome look up table 85. Syndrome look up table and error detection circuit 82 also comprises error detection circuit 86 shown in FIG. 12. The syndrome look up table 85 and the error detection circuit 86 will be discussed further below.

The 1st through 8th stages of register 72 are connected to the 1st through 8th of coset exclusive-ORs 76, respectively, which are in turn connected to the 1st through 8th stages of decoder output register 74, respectively. The 2nd, 3rd, 6th, 8th and 9th stages of register 72 are connected to syndrome exclusive-OR 80A. The 2nd, 4th, 5th, 7th, and 10th stages of register 72 are connected to syndrome exclusive-OR 80B. The 1st, 3rd, 4th, 7th, 8th and 11th stages of register 72 are connected to syndrome exclusive-OR 80C. The 1st, 5th, 6th, 7th, 8th, and 12th stages of register 72 are connected to syndrome exclusive-OR 80D. The 1st, 2nd, 3rd, 4th, 5th, 6th, and 13th stages of register 72 are connected to syndrome exclusive-OR 80E.

The outputs of syndrome exclusive-ORs 80A through 80E, respectively, provide the $S_1$ through $S_5$ signals, respectively, which are applied to syndrome look up table and error detection circuit 82. Each of the eight coset outputs 84 of syndrome look up table and error detection circuit 82 are applied to the respective exclusive-OR gate of exclusive-ORs 76.

The thirteen-bit signal $R^j=[r_1, r_2, r_3, r_4, r_5, r_6, r_7, r_8, r_9, r_{10}, r_{11}, r_{12}, r_{13}]$ passed from signal set mapper 54 (FIG. 2) is input into register 72 and the corrected information signal $I_j=[i_1, i_2, i_3, i_4, i_5, i_6, i_7, i_8]$ is output from register 74. An error detected and retransmit signal, $Y_d$, is output from syndrome look up table and error detection circuit 82. The signal $Y_d$ is a logic 1 when a detectable but not correctable error is found, and is a logic 0 when there is no error, a correctable error is found, or when the error cannot be detected.

Figure 10:
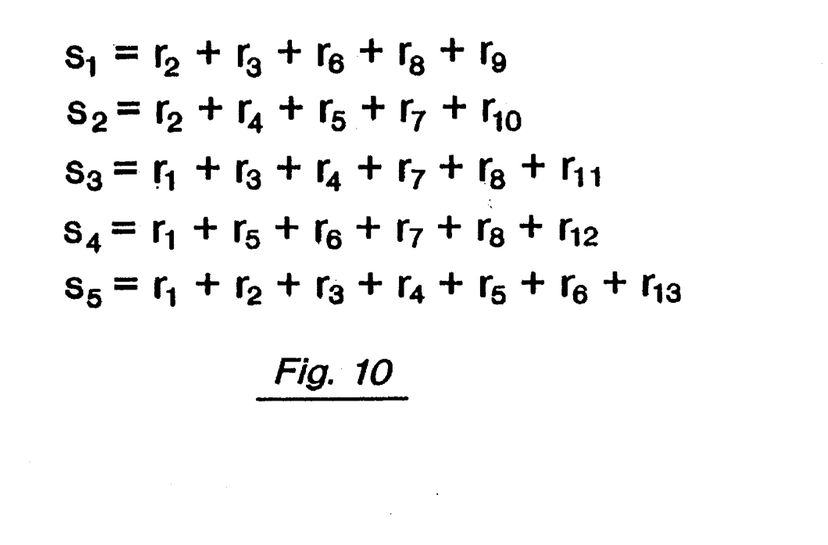
FIG. 10 illustrates how the individual bits of the syndrome matrix utilized in the RFID system of FIG. 1 are related to the individual bits of the received signal $R^j$.
Figure 11:
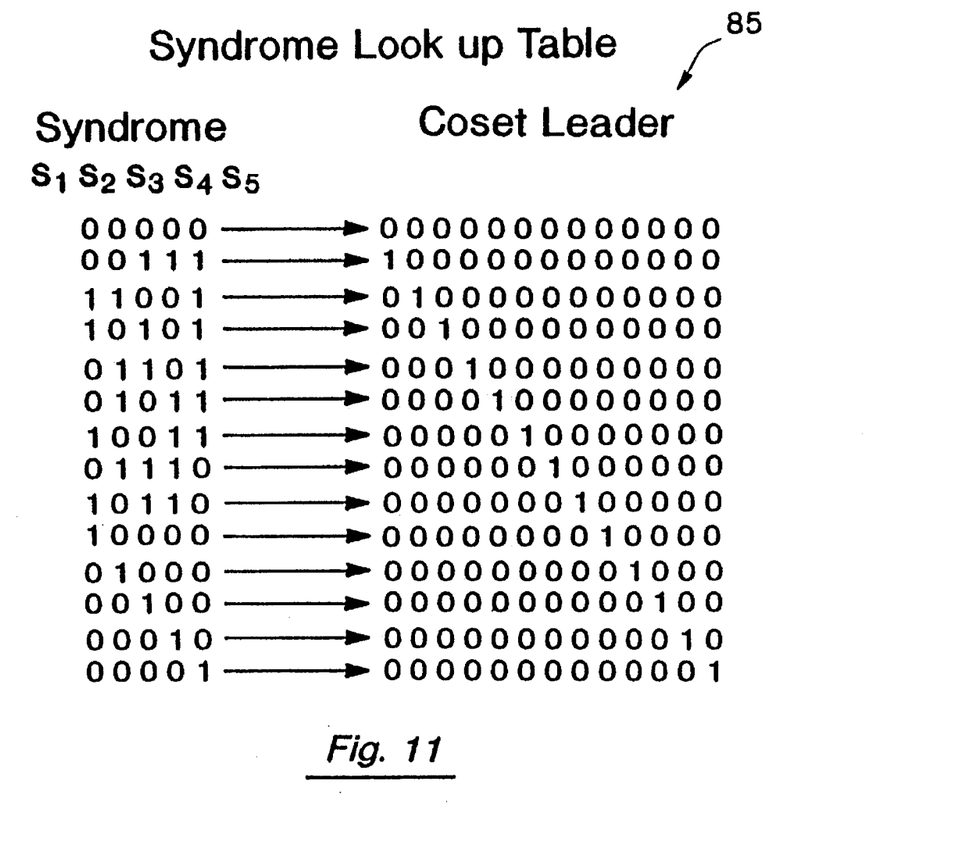
FIG. 11 shows a the preferred embodiment of a syndrome look up table utilized in the RFID system of FIG. 1.

FIG. 10 summarizes the Galois field additions carried out by syndrome exclusive-ORs 80 to provide the syndrome signals $S_1$ through $S_5$. FIG. 11 shows the syndrome look up table. A thirty-two-bit EPROM in syndrome look up table and error detection circuit 82 receives the syndrome signals $S_1$ through $S_5$ and provides the output shown in the coset leader table 85. For example, if the syndrome [1 1 0 0 1] is received, the coset leader [0 1 0 0 0 0 0 0] is output on lines 84 in FIG. 9. The exclusive-ORs 76 then subtract the coset leader from the first eight bits of the received signal $R^j$ to produce the corrected signal $I_j$.

The syndromes listed in the syndrome look up table 85 are all the syndromes that result in correctable signals in the (8, 13, 4) block code according to the invention. If other syndromes are received, then the error detection circuit of FIG. 12 outputs a logic 1 signal ($Y_d$) indicating that a detectable error that cannot be corrected has occurred.

4. Error Detection Circuit Details

Figure 12:
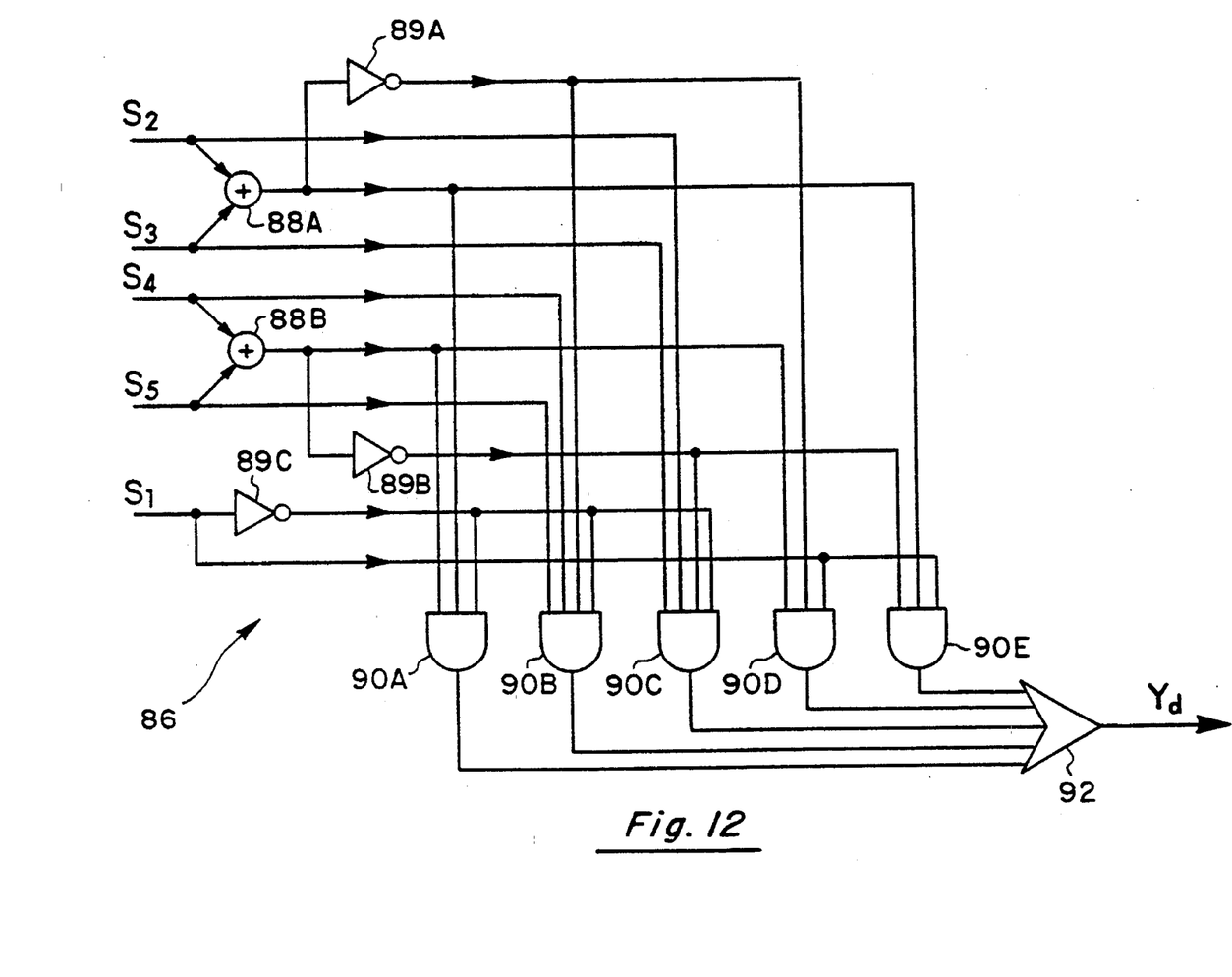
FIG. 12 shows the preferred embodiment of the error detection circuit utilized in the RFID system of FIG. 1.

The error detection circuit 86 of FIG. 12 comprises exclusive-OR gates 88A and 88B, inverters 89A, 89B, and 89C, 3-input AND gates 90A, 90D, and 90E, 4-input AND gates 90B and 90C, and 5-input OR gate 92. The $S_1$ signal (FIG. 9) is applied to the input of inverter 89C and one input of AND gates 90D and 90E. The $S_2$ signal is applied to one input of exclusive-OR 88A and one input of AND gate 90C. The $S_3$ signal is applied to the other input of exclusive-OR gate 88A and another input of AND gate 90C. The $S_4$ signal is applied to one input of exclusive-OR gate 88B and one input of AND gate 90B. The $S_5$ signal is applied to the other input of exclusive-OR gate 88B and another input of AND gate 90B.

The output of exclusive-OR 88A is applied to the input of inverter 89A and to an input of each of AND gates 90A and 90E. The output of exclusive-OR gate 88B is applied to the input of inverter 89B and one input of each or AND gates 90A and 90D. The output of inverter 89A is applied to one input of each of AND gates 90B and 90D. The output of invertor 89B is applied to one input of each of AND gates 90C and 90E. The output of inverter 89C is applied to one input of each of AND gates 90A, 90B, and 90C. The outputs of AND gates 90A through 90E are applied to the inputs of OR gate 92. The output of OR gate 92 provides the error detected retransmit signal $Y_d$.

It should be understood that although channel encoder 22 and channel decoder 34 including error detection circuitry 86 may be provided in an matching system, they may also be manufactured separately. That is to say, one manufacturer may make interrogator 12 having channel encoder 22 in accordance with the present invention, while another manufacturer may make RFID tags 14A, 14B, and 14C having channel decoder 34 in accordance with the present invention. Hence, the present invention is intended to encompass both matching systems and components of separately manufactured systems.

5. Detailed Description of Operation

The invention operates as follows. An operator enters data and a command into interrogator 12 via keyboard 18 or other input device. The data and command could be as simple as an identification number and a request to inquire whether an object having the identification number is present, it could be a request to take a preprogrammed inventory, or any other inputs. The processor and memory unit 12 of interrogator processes the data and commands and sends a signal or series of signals in one or more eight-bit blocks to channel encoder 22. Encoder 22 encodes each eight-bit block signal with the (8, 13, 4) block code as described above in reference to FIGS. 3 through 8. The encoded signal is passed to the RF section 24 where it is modulated and transmitted. The RFID tags 14A, 14B, and 14C receive the signal.

Focusing on RFID tag 14A as exemplary of the others, the signal is received by RF unit 32 and the received signal is passed to decoder 34, where it is decoded as described in reference to FIGS. 9 through 12 above. If the signal is a correct signal or a correctable one, it is passed to identification storage and processing means 36, which processes the signal. If the signal includes an identifier that matches an identifier programmed into RFID tag 14A, the tag 14A responds with a preprogrammed message. If the signal does not correspond to the programmed identifier, the tag 14A does not respond. If an error that cannot be corrected occurs, then the error detection circuit (FIG. 9) outputs a logic 1 signal ($Y_d$), which causes the identification storage and processing means 36 to output a retransmit message. This message is transmitted via return link unit 38 (FIG. 1) which is received by return link unit 26 in interrogator 12, in response to which processor 21 causes the interrogator 12 to retransmit the previous transmission.

It is a feature of the invention that the (8, 13, 4) encoder 22 and decoder 34 are particularly well suited for an RFID forward link. The encoder and decoder can be manufactured relatively inexpensively with state-of-the-art integrated circuit fabrication technology. They handle eight-bit information signals thereby providing faster throughput speeds for a given amount of information than prior art simple coding systems, and at the same time are easily handled by inexpensive data processing equipment. In addition they have the capability of correcting the majority of errors that may occur in an RFID forward link, and detecting practically all errors. Further, they provide a high ratio of information bits to error correction and detection bits.

Another feature of the invention is that the parity transformation of FIG. 8 is unique and results in relatively simple logic circuitry in encoder 22 and decoder 34.

A further feature of the invention is that the error detection circuit 86 is simple and inexpensive. It uses a minimum number of electronic components.

Yet another feature of the invention is that the (8, 13, 4) block code adds five extra bits for every eight data bits transmitted. Compared to the prior art (4, 8, 4) block code, which adds four extra bits for every four data bits transmitted, the (8, 13, 4) block code uses 19% less bits for the same error correction capability. The (8, 13, 4) block code is capable of correcting one bad bit in each thirteen-bit block. Further, it can always detect two bad bits per thirteen-bit block. Thus it is capable of detecting virtually every error in an RFID forward link, and can correct most errors without requiring repeated transmissions.

There has been described a novel RFID forward link that is both simple and efficient, and which has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that a simple, efficient (8, 13, 4) block code has been devised, it can be used in other applications. Or the various electronic elements described may be implemented in other designs and/or made with a variety of other components. A greater or lesser number of parts be used. The RFID system may have different and additional features. Consequently, the invention is to be construed as embracing each and every novel feature and novel combination of features present in and/or possessed by the radio frequency error detection device described.

What is claimed is:

1. A radio frequency identification system comprising:

a source of an information signal having eight-bit blocks;

(8, 13, 4) block code encoder means responsive to the information signal for providing a linear systematic block coded signal comprising a coded block having eight information bits and five code bits for each of the eight-bit blocks;

transmitter means responsive to the thirteen-bit linear systematic block coded signal for providing a transmitted signal;

receiver means responsive to the transmitted signal for providing a signal comprising received coded blocks;

(8, 13, 4) linear systematic block code decoder means for decoding the received coded blocks to provide a decoded signal comprising one eight-bit decoded block for each of the received coded blocks, the eight-bit decoded blocks being generated each time there are less than two bit errors in a received coded block;

means within the decoder for determining if there are exactly two bit errors in any of the received coded blocks;

means within the decoder for correcting one bit error operable each time only one bit error occurs in any of the received coded blocks; and identifier means responsive to the eight-bit decoded blocks for providing a return identification signal.

2. A radio frequency identification system as in claim 1 wherein the decoder means further comprises:

syndrome generator means responsive to the transmitted signal for providing a syndrome signal; and error detection circuit means responsive to the means for determining for providing a signal indicative that a noncorrectable error in the transmitted signal has been detected.

3. A radio frequency identification system as in claim 1 wherein the first eight bits of the coded signal comprise the eight bits, $i_1, i_2, i_3, i_4, i_5, i_6, i_7$, and $i_8$, of the information signal, and the last five bits of the coded signal comprise a first parity bit, a second parity bit, a third parity bit, a fourth parity bit, and a fifth parity bit.

4. A communication error detection and correction system comprising:

a source of an information signal having eight-bit blocks;

(8, 13, 4) block code encoder means responsive to the information signal for providing a systematic block coded signal comprising thirteen-bit blocks for each eight-bit block of the information signal;

communication means responsive to the linear systematic block coded signal for providing a communicated signal; and (8, 13, 4) linear systematic block code decoder means for decoding the communicated signal to provide a decoded signal having an eight-bit decoded block for each eight-bit block of the information signal, wherein the decoder means further comprises error detection circuit means for providing a signal indicative that a noncorrectable error in the communicated signal has been detected, wherein the error detection circuit means comprises eleven logic gates.

5. A communication error detection and correction system as in claim 4 wherein the eleven logic gates comprise two exclusive-OR gates, three inverters, five AND gates, and an OR gate.

6. A radio frequency identification circuit for receiving a transmitted thirteen-bit linear systematic block coded signal comprising:

memory for storing an identification code;

a linear systematic (8, 13, 4) block code decoder means responsive to the thirteen-bit coded signal for providing a decoded signal comprising eight-bits for each block of the transmitted coded signal;

a syndrome generator responsive to the transmitted signal for providing a syndrome signal; and an error detection circuit responsive to the syndrome signal for providing a signal indicative that a noncorrectable error in the transmitted signal has been detected; and identifier means responsive to the decoded signal for providing a return identification signal when the decoded signal matches the stored identification code, the identifier means being disabled in response to the signal from the error detection circuit.

* * * * *